United States Patent
Tada et al.

(10) Patent No.: US 6,905,768 B2
(45) Date of Patent: Jun. 14, 2005

(54) EPOXY RESIN COMPOSITION AND ELECTRONIC PART

(75) Inventors: Yuji Tada, Tokushima (JP); Shinji Nakano, Tokushima (JP)

(73) Assignee: Otsuka Chemical Co., Ltd., Osaka (JP)

(*) Notice: Subject to any disclaimer, the term of this patent is extended or adjusted under 35 U.S.C. 154(b) by 0 days.

(21) Appl. No.: 10/169,104

(22) PCT Filed: Jan. 11, 2001

(86) PCT No.: PCT/JP01/00083

§ 371 (c)(1),
(2), (4) Date: Nov. 18, 2002

(87) PCT Pub. No.: WO01/51562

PCT Pub. Date: Jul. 19, 2001

(65) Prior Publication Data

US 2003/0153650 A1 Aug. 14, 2003

(30) Foreign Application Priority Data

Jan. 14, 2000 (JP) .................................. 2000-006658
Oct. 11, 2000 (JP) .................................. 2000-310562

(51) Int. Cl.$^7$ ..................... B32B 27/38; H01L 21/56; C08L 63/00
(52) U.S. Cl. .................... 428/413; 438/127; 523/452
(58) Field of Search ................ 523/400, 435, 523/440, 443, 451, 452; 428/413; 438/127

(56) References Cited

U.S. PATENT DOCUMENTS 6,399,677 B2 * 6/2002 Tomiyoshi et al. ......... 523/466
6,528,559 B1 * 3/2003 Nakacho et al. ............ 524/116
6,596,893 B2 * 7/2003 Nakacho et al. ............ 558/157

FOREIGN PATENT DOCUMENTS

| EP | 0 945 478 A1 | | 9/1999 | |
|----|----|----|----|----|
| JP | 10-259292 | | 9/1998 | |
| WO | WO 00/09518 | * | 2/2000 | ............. C07F/9/08 |

* cited by examiner

*Primary Examiner*—Michael J. Feely
(74) *Attorney, Agent, or Firm*—Armstrong, Kratz, Quintos, Hanson & Brooks, LLP

(57) ABSTRACT

The epoxy resin of the invention comprises (A) an epoxy resin, (B) at least one member selected from the group consisting of a phenolic hydroxyl group-containing compound, a urea resin and a melamine resin, (C) a crosslinked phenoxyphosphazene compound, and (D) an inorganic filler powder, the amount of component (C) being in the range of 0.01 to 30 wt. % based on the total amount of components (A), (B) and (C), and the amount of component (D) being in the range of 60 to 98 wt. % based on the total amount of components (A), (B), (C) and (D). The epoxy resin composition of the invention and a molded product are halogen-free and antimony-free and are excellent in flame retardancy. When an element for an electronic part such as LSI and VLSI is encapsulated by the epoxy resin composition of the invention, the obtained electronic part is outstanding in heat resistance, moisture resistance, thermal impact resistance and like properties.

11 Claims, No Drawings

EPOXY RESIN COMPOSITION AND ELECTRONIC PART

FIELD OF THE INVENTION

The present invention relates to an epoxy resin composition and an electronic part.

BACKGROUND ART

Epoxy resins are used in extensive fields of electrical and electronic materials, sealing materials, coating materials, adhesives, civil engineering and construction materials, composite materials for aerospace and the like, because epoxy resins are well-balanced in properties such as electrical properties, resistance to humidity, resistance to heat, mechanical properties, adhesion to molded products produced by insert molding and also because it is possible to provide an epoxy resin composition which are imparted various properties by inclusion of other components.

For example, although metals, ceramics, phenolic resins, silicone resins or the like have been used as an encapsulating material for elements of electronic parts such as LSI, VLSI and the like, epoxy resins are frequently used in recent years because of economy, productivity and well-balanced properties.

On the other hand, it is mandatory for electronic parts having LSI, VLSI or the like to have flame retardancy which complies with UL standard in order to assure safety. For this reason, halogen compounds, antimony trioxide, metal hydroxides or like flame retardants are mixed with an epoxy resin.

However, an epoxy resin mixed with a halogen compound has a drawback that a poisonous gas and a toxic compound are generated on combustion of a molded product of such epoxy resin.

Further, the use of antiomony trioxide which is presumably carcinogenic is undesirable. Moreover, an epoxy resin mixed with antimony trioxide lowers the arc resistance of a molded product of epoxy resin, resulting in reduced insulating property.

In addition, metal hydroxides such as aluminum hydroxide or magnesium hydroxide can not exhibit the desired flame retardancy unless mixed with an epoxy resin in a large amount. Thus the metal hydroxide presents a problem of decreasing the mechanical property of the obtained molded product of epoxy resin.

To overcome these problems, a technique was developed in which an epoxy resin is mixed with red phosphorus, phosphates, organic phosphorus compounds or like phosphorus compounds.

Japanese Unexamined Patent Publications No. 100108/1996, No. 151427/1996, No. 151505/1996 and No. 287795/1998 disclose flame-retardant epoxy resin compositions containing red phosphorus. However, red phosphorus reacts with a small amount of water, giving phosphine and corrosive phosphoric acid. Consequently a flame-retardant epoxy resin composition containing red phosphorus is problematic in respect of resistance to moisture. For this reason, the flame-retardant epoxy resin composition containing red phosphorus can not be used as an encapsulant for a semiconductor which requires high resistance to moisture. Red phosphorus particles coated with aluminum hydroxide, thermosetting resin or the like unavoidably give phosphine and corrosive phosphoric acid on reaction with a small amount of water, resulting in insufficient moisture resistance.

Japanese Unexamined Patent Publication No. 43536/1999 discloses a flame-retardant epoxy resin composition containing phosphate. However, phosphate is low in moisture resistance and thus the disclosed flame-retardant epoxy resin composition can not be used as an encapsulant for a semiconductor.

Japanese Unexamined Patent Publications No. 11662/1992, No. 230340/1993, No. 214068/1993, No. 80765/1994, No. 188638/1996 disclose flame-retardant epoxy resin compositions containing an organic phosphorus compound. However, the organic phosphorus compounds used in these patent publications raise problems about toxicity. Furthermore, molded products formed from each of the epoxy resin compositions disclosed in these patent publications are unsatisfactory in heat resistance and moisture resistance.

In addition, an epoxy resin composition containing a phosphazene compound as a flame retardant has been known. For example, Japanese Unexamined Patent Publications No. 120850/1986, No. 349/1988, and No. 259292/1998 and Japanese Examined Patent Publication No. 53787/1994 disclose flame-retardant epoxy resin compositions containing a phenoxyphosphazene compound. Further Japanese Unexamined Patent Publication No. 109346/1987 and Japanese Patent No. 2857444 disclose epoxy resin compositions containing a fluorine-containing phosphazene compound.

However, these epoxy resin compositions containing a phosphazene compound are not satisfactory in all of heat resistance, thermal impact resistance, solder crack resistance (heat resistance of solder) and moisture resistance which are required by an encapsulant for a semiconductor such as VLSI.

In view of the above, there is a demand for development of an epoxy resin composition which is satisfactory in all of heat resistance, thermal impact resistance, solder cracking resistance (heat resistance of solder) and moisture resistance required by an encapsulant for a semiconductor such as VLSI, the epoxy composition being suitably used as an encapsulant for a semiconductor.

DISCLOSURE OF THE INVENTION

An object of the present invention is to provide a halogen-free and antimony-free epoxy resin composition having excellent flame retardancy from a viewpoint of environmental preservation.

Another object of the invention is to provide an epoxy resin composition having excellent heat resistance, thermal impact resistance, solder cracking resistance and moisture resistance which are required by an encapsulant for a semiconductor such as LSI.

A further object of the invention is to provide an electronic part which includes an element such as a semiconductor encapsulated with an epoxy resin composition.

Other features of the present invention will become apparent from the following description.

To overcome the above-mentioned drawbacks of prior art, the present inventors conducted extensive research and found that the epoxy resin composition which can achieve the foregoing objects can be prepared by incorporating a crosslinked phosphazene compound as component (C) and an inorganic filler powder as component (D) in specific proportions into an epoxy resin composition. Based on this novel finding, the invention was completed.

According to the invention, there is provided an epoxy resin composition comprising (A) an epoxy resin, (B) at least one member selected from the group consisting of a phenolic hydroxyl group-containing compound, a urea resin and a melamine resin, (C) a crosslinked phenoxyphosphazene compound, and (D) an inorganic filler powder, the amount of component (C) being in the range of 0.01 to 30 wt. % based on the total amount of components (A), (B) and (C), and the amount of component (D) being in the range of 60 to 98 wt. % based on the total amount of components (A), (B), (C) and (D).

According to the present invention, there is provided the above-mentioned epoxy resin composition, wherein component (B) is a phenolic hydroxyl group-containing compound.

According to the present invention, there is provided the epoxy resin composition, wherein the crosslinked phenoxyphosphazene compound serving as component (C) is a crosslinked phenoxyphosphazene compound in which at least one phosphazene compound selected from the group consisting of a cyclic phenoxyphosphazene represented by the formula (1)

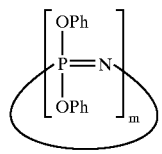
(1)

(wherein m is an integer of 3 to 25 and Ph is a phenyl group) and a linear phenoxyphosphazene represented by the formula (2)

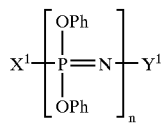
(2)

(wherein $X^1$ represents a group —N=P(OPh)$_3$ or a group —N=P(O)OPh, $Y^1$ represents a group —P(OPh)$_4$ or a group —P(O)(OPh)$_2$, and n is an integer of 3 to 10000 and Ph is as defined above) is crosslinked with at least one crosslinking group selected from the group consisting of o-phenylene group, m-phenylene group, p-phenylene group and a bisphenylene group represented by the formula (3)

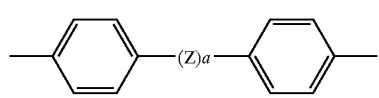
(3)

(wherein Z is —C(CH$_3$)$_2$—, —SO$_2$—, —S— or —O— and a is 0 or 1);

(a) each of the crosslinking groups is interposed between the two oxygen atoms left after the elimination of phenyl groups from the phosphazene compound;

(b) the amount of the phenyl groups in the crosslinked compound is 50 to 99.9% based on the total amount of the phenyl groups in said phosphazene compound represented by the formula (1) and/or said phosphazene compound represented by the formula (2); and (c) the crosslinked phenoxyphosphazene compound has no free hydroxyl group in the molecule.

According to the present invention, there is provided an electronic part formed by encapsulating an element for an electronic part with the foregoing epoxy resin composition.

According to the present invention, there is provided an electronic part which entirely or partly comprises a molded product produced by molding the foregoing epoxy resin composition.

Component (A)

Conventional epoxy resins can be widely used as component (A) for use in the invention insofar as they are useful as the epoxy resin molding material for an electronic part.

Examples of such epoxy resin are phenol novolak epoxy resin, brominated phenol novolak epoxy resin, ortho-cresol novolak epoxy resin, naphthol novolak epoxy resin and like novolak epoxy resins prepared by reaction of a phenol with an aldehyde; bisphenol-A epoxy resin, brominated bisphenol-A epoxy resin, bisphenol-F epoxy resin, bisphenol-AD epoxy resin, bisphenol-S epoxy resin and like bisphenol epoxy resins; 4,4'-bis(2,3-epoxypropoxy)-3,3',5,5'-tetramethylbiphenyl and like alkyl-substituted biphenol epoxy resins; tris(hydroxyphenyl)methane epoxy resin and like phenol epoxy resins prepared by reaction of phenol with epichlorohydrin; aliphatic epoxy resins prepared by reaction of trimethylolpropane, oligo-propylene glycol, hydrogenated bisphenol-A or like alcohol with epichlorohydrin; glycidyl ester epoxy resins prepared by reaction of hexahydrophthalic acid, tetrahydrophathalic acid or phthalic acid with epichlorohydrin or 2-methylepichlorohydrin; glycidylamine epoxy resins prepared by reaction of diaminodiphenylmethane, aminophenol or like amine with epichlorohydrin; heterocyclic epoxy resins prepared by reaction of isocyanuric acid or like polyamine with epichlorohydrin and epoxy resins prepared by modifying them, etc. These epoxy resins have a number average molecular weight of about 300 to about 100,000, preferably about 500 to about 10,000, and an epoxy equivalent of about 100 to about 10,000, preferably about 150 to about 1,000. These epoxy resins can be used either alone or in combination in the invention.

Among the above-described epoxy resins, preferred epoxy resins are phenol novolak epoxy resins, 4,4'-bis(2,3-epoxypropoxy)-3,3',5,5'-tetramethylbiphenyl and like alkyl-substituted biphenol epoxy resins, tris(hydroxyphenyl) methane epoxy resin and the like. When these preferred epoxy resins are used, epoxy resin compositions excellent in thermal impact resistance and moisture resistance can be prepared.

While it is the most desirable to use these preferred epoxy resins alone, they may be used in mixture with other epoxy resin from the viewpoints of economy and the like. In this case, the preferred epoxy resin is used in an amount of 50 wt. % or more based on the total amount of epoxy resins used.

Component (B)

It is known to use, as a curing agent for epoxy resins, a phenolic hydroxyl group-containing compound, aromatic amine compound, acid anhydride, urea resin, melamine resin and the like. From the viewpoint of pot life and the like, a phenolic hydroxyl group-containing compound, urea resin and melamine resin are used as component (B) in the invention. When a phenolic hydroxyl group-containing compound, urea resin and melamine resin are used as component (B), high moisture resistance and other properties can be imparted to a molded product produced by molding the epoxy resin composition due to synergistic effect achieved by component (B) and the crosslinked phenoxyphosphazene compound as component (C).

The phenolic hydroxyl group-containing compound to be used as component (B) in the invention includes a wide variety of known compounds having phenolic hydroxyl groups insofar as the compounds act as an curing agent on component (A).

The urea resin and melamine resin to be used in the invention include a wide variety of known urea resins and melamine resins insofar as the resins act as an curing agent on component (A).

From the viewpoint of moisture resistance and the like, it is preferable in the invention to use the phenolic hydroxyl group-containing compound as component (B).

Typical examples of such phenolic hydroxyl group-containing compound include phenolic resins. The phenolic resin is generally classified into resol phenolic resins and novolak phenolic resins. These phenolic resins are prepared by condensing, for example, phenol, cresol, xylenol, resorcin, catechol, bisphenol A, bisphenol F or like phenols or alpha-naphthol, beta-naphthol, dihydroxynaphthalene or like naphthols with formaldehyde, acetaldehyde, propionaldehyde, benzaldehyde, salicylic aldehyde or like aldehydes. Phenolic resins useful in the invention include polyparavinyl phenolic resins, xylylene group-containing phenol/aralkyl resins are prepared from a phenol and dimethoxyparaxylene, dicyclopentadiene-modified phenolic resin, triphenolmethane condensates, etc.

Among the above-mentioned phenolic resins, novolak phenolic resins are preferred and among them, phenolic novolak resins, cresol novolak resins and the like are more preferred.

Although the proportions of components (A) and (B) are not limited, component (B) may be used in the range of amount in which component (B) can act as the curing agent on component (A).

For example, while the equivalent ratio of epoxy resin as component (A) and the phenolic hydroxyl group-containing compound as component (B)(number of hydroxyl group of component (B)/number of epoxy group of component (A)) is not limited, it is preferred to set the equivalent ratio in the range of approximately 0.7 to 1.3.

Component (C)

Examples of component (C), i.e., crosslinked phenoxyphosphazene compound to be used as the flame retardant in the invention include a wide range of those known.

Also, the following crosslinked phenoxyphosphazene compound prepared by the present inventors can be used. Such crosslinked phenoxyphosphazene compound is a crosslinked phenoxyphosphazene compound in which at least one phosphazene compound selected from the group consisting of a cyclic phenoxyphosphazene of the formula (1) and a linear phenoxyphosphazene of the formula (2) is crosslinked with at least one crosslinking group selected from the group consisting of o-phenylene group, m-phenylene group, p-phenylene group and a bisphenylene group represented by the formula (3), wherein (a) each of the crosslinking groups is interposed between the two oxygen atoms left after the elimination of phenyl groups from the phosphazene compound; (b) the amount of the phenyl groups in the crosslinked compound is 50 to 99.9% based on the total amount of the phenyl groups in said phosphazene compound of the formula (1) and/or said phosphazene compound of the formula (2); and (c) the crosslinked phenoxyphosphazene compound has no free hydroxyl group in the molecule.

It is desirable in the invention to use the crosslinked phenoxyphosphazene compound having no free hydroxyl group in the molecule.

In this specification, the term "having no free hydroxyl group in the molecule" means that the amount of free hydroxyl group is less than the detectable limit, when determined according to the acetylation method using acetic anhydride and pyridine as described on page 353 of Analytical Chemistry Handbook (revised 3rd edition, edited by Japan Analytical Chemistry Academy, published by Maruzen Co., Ltd., 1981). Herein the term "detectable limit" means the minimum amount detectable as hydroxyl equivalents per gram of a test sample (crosslinked phenoxyphosphazene compound of the invention), more specifically $1 \times 10^{-6}$ hydroxyl equivalents/gram or less.

On analysis of the crosslinked phenoxyphosphazene compound of the invention by the foregoing acetylation method, the resulting amount includes the amount of hydroxyl groups in the residual phenol used as a starting material. Since the quantity of the starting material phenol can be determined by high-performance liquid chromatography, the amount of free hydroxyl groups in the crosslinked phenoxyphosphazene compound can be precisely determined.

The crosslinked phenoxyphosphazene compounds of the invention can be prepared, for example, by reacting at least one dichlorophosphazene compound selected from the group consisting of a cyclic dichlorophosphazene compound represented by the formula (4)

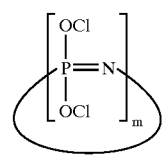

(4)

(wherein m is as defined above) and a linear dichlorophosphazene compound represented by the formula (5)

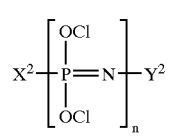

(5)

(wherein $X^2$ represents a group $-N=PCl_3$ or a group $-N=P(O)Cl$, $Y^2$ represents a group $-PCl_4$ or a group $-P(O)Cl_2$, and n is as defined above) with a mixture of alkali metal phenolate represented by the formula (6)

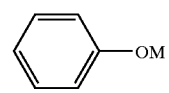

(6)

(wherein M is an alkali metal) and at least one diphenolate selected from the group consisting of alkali metal diphenolate represented by the formula (7)

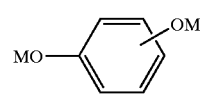

(7)

(wherein M is as defined above) and alkali metal diphenolate represented by the formula (8)

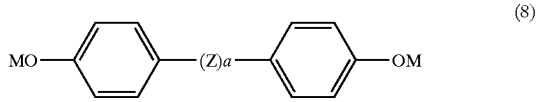

(wherein Z, a and M are as defined above) (first step);
and further reacting the resulting compound with the alkali metal phenolate (second step).

The dichlorophosphazene compounds of the formulas (4) and (5) for use as starting materials in the foregoing production process can be produced by known methods, for example, as described in Japanese Unexamined Patent Publication No. 87427/1982, Japanese Examined Patent Publications Nos. 19604/1983, 1363/1986 and 20124/1987, H. R. Allcock "Phosphorus-Nitrogen Compounds", Academic Press, (1972), and J. E. Mark, H. R. Allcock, R. West "Inorganic Polymers" Prentice-Hall International, Inc., (1992), etc.

An exemplary method comprises reacting ammonium chloride and phosphorus pentachloride (or ammonium chloride, phosphorus trichloride and chlorine) at about 120 to about 130° C. in chlorobenzene or tetrachloroethane, followed by removal of hydrochloric acid. Thereby there can be obtained a dichlorophosphazene compound of the formula (4) wherein m is 3 to 25 or dichlorophosphazene compound of the formula (5) wherein n is 3 to 25. These dichlorophosphazene compounds (dichlorophosphazene oligomers) can be obtained usually as a mixture.

From the mixture of cyclic and chain-like dichlorophosphazene oligomers thus obtained, cyclic dichlorophosphazene compound such as hexachlorocyclo-triphosphazene, octachlorocyclotetraphosphazene, decachlorocyclopentaphosphazene or the like is obtained by distillation or recrystallization, and by heating hexachlorocyclotriphosphazene at 220 to 250° C. to undergo ring-opening polymerization, a dichlorophosphazene compound of the formula (5) wherein n is 25 to 10,000 is produced.

The dichlorophosphazene compounds prepared above may be used as a mixture of cyclic and linear dichlorophosphazene compounds or may be singly used as separated.

Examples of alkali metal phenolates represented by the formula (6) include a wide range of those known, and are sodium phenolate, potassium phenolate, lithium phenolate and so on. These alkali metal phenolates can be used either alone or in combination.

The positional relation of two —OM groups (wherein M is as defined above) in alkali metal diphenolate of the formula (7) can be any of ortho, meta and para. Examples of alkali metal diphenolates include alkali metal salts of resorcinol, hydroquinone, catechol and the like, of which sodium salts and lithium salts are preferred. These alkali metal diphenolates can be used either alone or in combination.

Examples of alkali metal diphenolates represented by the formula (8) include alkali metal salts of 4,4'-isopropylidenediphenol (bisphenol-A), 4,4'-sulfonyldiphenol (bisphenol-S), 4,4'-thiodiphenol, 4,4'-oxydiphenol, 4,4'-diphenol and the like, of which sodium salts and lithium salts are preferred. These alkali metal diphenolates are used either alone or in combination.

According to the present invention, alkali metal diphenolate of the formula (7) and alkali metal diphenolate of the formula (8) can be used either alone or in combination.

In the first step of the production process in the invention, it is desirable to adjust the amounts of alkali metal phenolate and alkali metal diphenolate such that not all chlorine atoms in the dichlorophosphazene compound are consumed by the reaction with alkali metal phenolate and alkali metal diphenolate, namely, some chlorine atoms in the dichlorophosphazene compound remain as they are after the reaction with alkali metal phenolate and alkali metal diphenolate. Consequently, —OM groups (wherein M is as defined above) at both sides in alkali metal diphenolate combine with phosphorus atoms of the dichlorophosphazene compound. In the first step, the alkali metal phenolate and the alkali metal diphenolate are used usually in such amounts that the combined amount of both phenolates, relative to the chlorine content of the dichlorophosphazene compound, is about 0.05 to about 0.9 equivalent, preferably about 0.1 to about 0.8 equivalent.

In the second step of the production process in the invention, it is desirable to adjust the amounts of alkali metal phenolate such that chlorine atoms and free hydroxyl groups in the compound obtained by the first step can be all consumed by the reaction with alkali metal phenolate. According to the present invention, the alkali metal phenolate is used usually in an amount of about 1 to about 1.5 equivalents, preferably about 1 to about 1.2 equivalents, relative to the chlorine content of the dichlorophosphazene compound.

According to the present invention, the ratio of the alkali metal phenolate (the total amount thereof used in the first and second steps) and alkali metal diphenolate (alkali metal diphenolate/alkali metal phenolate, molar ratio) is usually about 1/2000 to about 1/4, preferably about 1/20 to about 1/6.

The reactions in the first step and the second step are carried out at a temperature usually between room temperature and about 150° C., preferably about 80 to about 140° C., and the reactions are completed usually in about 1 to about 12 hours, preferably about 3 to about 7 hours. The reactions in the first step and the second step are carried out in an organic solvent, such as aromatic hydrocarbons such as benzene, toluene and xylene; and halogenated aromatic hydrocarbons such as monochlorobenzene and dichlorobenzene.

The crosslinked phenoxyphosphazene compound of the invention obtained by the above reactions can be easily isolated and purified from the reaction mixture by a conventional isolation method such as washing, filtration, drying or the like.

The decomposition temperature of the crosslinked phenoxyphosphazene compound of the invention is usually in the range of 250 to 350° C.

The proportion of the phenyl groups in the crosslinked phenoxyphosphazene compound of the invention is 50 to 99.9%, preferably 70 to 90%, based on the total amount of the phenyl groups in the cyclic phenoxyphosphazene of the formula (1) and/or linear phenoxyphosphazene of the formula (2).

It is preferred that n in the formula (2) is an integer of 3 to 1000.

The terminal groups $X^1$ and $Y^1$ in the formula (2) may vary in accordance with the reaction conditions and other factors. If the reaction is carried out under ordinary conditions, e.g., under mild conditions in a non-aqueous system, the resulting product will have a structure wherein $X^1$ is —N=P(OPh)$_3$ and $Y^1$ is —P(OPh)$_4$. If the reaction is carried out under such conditions that moisture or an alkali metal hydroxide is present in the reaction system, or under so severe conditions that a rearrangement reaction occurs, the resulting product will have a structure wherein $X^1$ is —N=P(OPh)$_3$ and $Y^1$ is —P(OPh)$_4$ in mixture with a structure wherein $X^1$ is —N=P(O)OPh and $Y^1$ is —P(O)(OPh)$_2$.

The amount of the crosslinked phenoxyphosphazene compound to be used as component (C) in the invention needs to be in the range of 0.01 to 30 wt. % based on the total amount of components (A), (B) and (C). When amount of the crosslinked phenoxyphosphazene compound to be used as component (C) is less than 0.01 wt. %, the intended flame retardant effect is not exhibited, whereas the amount of the crosslinked phenoxyphosphazene compound exceeding 30 wt. % impairs the properties. It is preferable that the amount of the crosslinked phenoxyphosphazene compound to be used as component (C) in the invention is in the range of 0.1 to 25 wt. %, especially 1 to 20 wt. %, based on the total amount of components (A), (B) and (C).

The above crosslinked phenoxyphosphazene compound serving as component (C) in the invention is free of chlorine, bromine or like halogen atoms and contains substantially no one-side hydroxy group of dihydroxy compound so that it is unlikely to emit a gas or smoke harmful to organisms due to hydrogen halide or the like in decomposition or combustion.

High flame retardancy is imparted to the epoxy resin composition and to a molded by incorporating the crosslinked phenoxyphosphazene compound of the invention thereinto.

By incorporating the crosslinked phenoxyphosphazene compound of the invention into the epoxy resin composition, the composition is given heat resistance, thermal impact resistance, solder crack resistance, thermal impact resistance and moisture resistance which are required by an encapsulant for an element for electronic parts such as a semiconductor.

Component (D)

It is necessary in the invention to use an inorganic filler powder as a filler from the viewpoints of reduced hygroscopicity and increased strength. Inorganic filler powders usually incorporated into epoxy resin compositions for electronic parts can be used as an inorganic filler powder serving as component (D) in the invention.

Examples of useful inorganic filler powders are powders or spherical beads of fused silica, crystalline silica, alumina, zircon, calcium silicate, calcium carbonate, silicon carbide, boron nitride, beryllium oxide, zirconia, titanium white, clay, mica, talc and the like. They are used either alone or in combination.

Useful powders have an average particle size of usually about 0.1 to about 100 µm, and useful beads have an average particle size of usually about 1 to about 50 µm, preferably about 1 to about 10 µm, more preferably about 2 to about 5 µm.

The amount of the inorganic filler powder to be used is 60 to 98 wt %, preferably 70 to 95 wt %, based on the total amount of the epoxy resin composition from the viewpoints of hygroscopicity, decrease in coefficient of linear expansion, increase in strength and the like.

Among the above-described inorganic fillers, soluble silica is preferred from the viewpoint of decrease in coefficient of linear expansion, and alumina is preferred from the viewpoint of high heat conductivity. A preferred shape of inorganic fillers is a bead from the viewpoints of fluidity in molding operation and abrasion of mold.

Other Additives

A curing accelerator can be incorporated into the resin composition of the invention to accelerate the curing reaction of components (A) and (B).

Useful curing accelerators include, for example, a wide variety of conventional curing accelerators such as dicycloamidine, salts thereof, tertiary amine, imidazole, quaternary ammonium salts, organic phosphine, tetraphenyl boron salts, etc.

Examples of dicycloamidine and salts thereof are 1,8-diazabicyclo(5,4,0)undecene-7, 1,5-diazabicyclo(3,4,0)nonene-5 and like dicycloamidines and their phenol salts, octyl salts, oleic acid salts, etc.

Examples of tertiary amine are triethanolamine, tetramethylbutanediamine, tetramethylpentanediamine, tetramethylhexanediamine, triethylenediamine, dimethylaniline, benzyldimethylamine, dimethylaminoethanol, dimethylaminopentanol and like oxyalkylamines, tris(dimethylaminomethyl)phenol, N-methylmorpholine, N-ethylmorpholine, etc.

Example of imidazole are 2-methylimidazole, 2-ethylimidazole, 2-phenylimidazole, 2-undecylimidazole, 2-heptadecylimidazole, 2-methyl-4-ethylimidazole, 2-phenyl-4-methylimidazole, 1-butylimidazole, 1-propyl-2-methylimidazole, 1-benzyl-2-methylimidazole, 1-cyanoethyl-2-methylimidazole, 1-cyanoethyl-2-undecylimidazole, 1-cyanoethyl-2-phenylimidazole, 1-azine-2-methylimidazole, 1-azine-2-undecylimidazole, etc.

Examples of quaternary ammonium salts are cetyltrimethylammonium bromide, cetyltrimethylammonium chloride, dodecyltrimethylammonium iodide, trimethyldodecylammonium chloride, benzyldimethyltetradecylammonium chloride, benzylmethylpalmitylammonium chloride, allyldodecyltrimethylammonium bromide, benzyldimethylstearylammonium bromide, stearyltrimethylammonium chloride, benzyldimethyltetradecylammonium acetate, etc.

Examples of organic phosphine are tributylphosphine, methyldiphenylphosphine, triphenylphosphine, etc.

Examples of tetraphenylboron salt are triphenylphosphine-tetraphenyl borate, tetraphenylphosphonium-tetraphenyl borate, triethylamine-tetraphenyl borate, N-methylmorpholine-tetraphenyl borate, 2-ethyl-4-methylimidazole-tetraphenyl borate, 2-ethyl-1,4-dimethylimidazole-tetraphenyl borate, etc.

Of these curing accelerators, organic phosphine, tetraphenylboron salts and the like are preferred, and triphenylphosphine, triphenylphosphine-tetraphenyl borate, triethylamine-tetraphenyl borate, etc. are more preferred.

Other additives can be added in the range in which the performance of the epoxy resin composition is not deteriorated. For example, the epoxy resin composition of the invention may contain other additives including: mold release agents such as natural wax (e.g. carnauba wax), synthetic wax, higher fatty acid, metal salt of higher fatty acid, acid amide, ester, paraffin and the like; flame retardants such as chlorinated paraffin, brominated toluene, hexabromobenzene, antimony trioxide and the like; and coloring agents such as carbon black, iron oxide red and the like; coupling agents such as epoxysilane, aminosilane, ureidosilane, vinylsilane, alkyl silane, organic titanate, aluminum alcoholate and the like.

At least one flame retardant selected from the group consisting of aluminum hydroxide, magnesium hydroxide and zinc borate can be used in the range in which the performance of the epoxy resin composition of the invention is not deteriorated.

The epoxy resin composition of the invention may contain fibrous materials. The epoxy resin composition of the invention containing fibrous materials can be used as fibrous reinforced plastics.

Useful fibrous materials are not limited and include any known fibrous materials such as alumina fibers, carbon fibers, silicon carbide fibers, silicon nitride fibers, glass fibers, potassium titanate fibers, sodium titanate fibers, wollastonite, titanium dioxide fibers, magnesium borate fibers, aluminum borate fibers and like inorganic fibers, aramide fibers, polyvinyl alcohol fibers, polyacrylonitrile fibers, polyester fibers, polyolefin fibers, polyarylate fibers, ultrahigh molecular weight polyethylene fibers and like organic synthetic fibers. These fibrous materials can be used either alone or in combination.

These fibrous materials may be processed into twilled fabrics, plain fabrics, satin fabrics and like fabrics, non-woven fabrics, sheets produced by papermaking process and like sheets, and the obtained products may be impregnated with the epoxy resin composition of the invention for various uses. Sheets of paper may be impregnated with the epoxy resin composition of the invention.

Further the epoxy resin composition of the invention may contain at least one kind of plate-like, fibrous or powdery electrically conductive inorganic materials and/or at least one kind of plate-like, fibrous or powdery dielectric inorganic materials. The incorporation of inorganic materials enables the use of the composition as an electrically conductive or dielectric functional materials.

The resin composition of the invention can be prepared by any method which can uniformly disperse and mix the raw materials. Methods generally employed comprise fully mixing specified amounts of raw materials by a mixer or the like, melting and kneading the mixture by a mixing roll, an extruder or the like, and cooling and pulverizing the same.

The epoxy resin composition of the invention can be used in the same form as conventional epoxy resin compositions, e.g. moldings, paste and solutions, and may be used as an encapsulating material, insulating material, reinforcing material, protective material, coating material, heat-insulating material, sound-proof material, adhesive, paint or the like.

The epoxy resin composition of the invention can be used for substantially all known electronic parts, and are preferably used as an encapsulant for an element for an electronic part and as a substrate material for wiring boards.

When the epoxy resin composition of the invention is used for encapsulating an element for an electronic part such as IC elements, various known methods can be widely employed. For example, electronic parts can be produced by a method comprising mounting an IC element on a support material, connecting the element to a circuit pattern previously formed, and encapsulating the required parts using a solution or a paste of the epoxy resin composition of the invention, useful support materials being inclusive of lead frames, wired tape carriers, wiring boards, glass, silicon wafers and the like, and useful IC elements being inclusive of semiconductor chips, transistors, diodes, thyristors, and like active elements, condensers, resistors, coils and like passive elements, etc.

Mounting methods are not limited and include, for example, methods of lead frame package, surface mounting package [SOP (small outline package), SOJ (small outline j-leaded package), QFP (quad flat package), BGA (ball grid array), etc.], CSP (chip size/scale package), etc.

Methods of connecting the IC element to a circuit pattern are not limited and include conventional methods such as wire bonding, TAB (tape automated bonding), flip chip bonding and the like.

While low pressure transfer molding method is carried out as an encapsulating method most frequently, injection molding method, compression molding method, casting molding method and the like may be employed. In this case, the formulation of the resin composition of the invention can be properly changed according to conditions such as the kind of support materials for mounting elements, kind of elements to be mounted, mounting methods, connecting methods, encapsulating methods, etc.

The resin composition of the invention may be used as an adhesive for mounting an IC element, solder ball, lead frame, heat spreader, stiffener or like parts on a support material.

Optionally a film molded from the resin composition of the invention can be used as an encapsulating material for secondary mounting.

Electronic parts produced in this way include, for example, TCP (tape carrier package) in which a semiconductor chip bonded by bump to a tape carrier is encapsulated with the resin composition of the invention. Other examples include a COB module, hybrid IC, multi-chip module or the like in which a semiconductor chip, integrated circuit, large scale integrated circuit, transistor, diode, thyristor or like active elements, condenser, resistor, coil or like passive elements bonded to wiring on a wiring board or glass substrate with wire bonding, flip chip bonding, solder or the like is encapsulated with the resin composition of the invention.

When the resin composition of the invention is used as a substrate material for a wiring board, conventional methods can be employed. For example, a prepreg is produced by impregnating a sheet of paper, glass fiber cloth, aramide fiber cloth or like substrate with the resin composition of the invention for use as a substrate material for a wiring board. The resin composition of the invention may be molded into a film for use as a substrate material for a wiring board. In this operation, an electrically conductive material or dielectric material may be incorporated into the resin composition to form an electrically conductive layer, an anisotropic electrically conductive layer, a conductivity contolling layer, a dielectic layer, anisotropic dielectric layer, dielectric constant controlling layer and like functional layer. Moreover, the layer may be used as a bump made of a resin or as an electrically conductive layer formed on the inside of a through hole.

The resin composition of the invention can be used as an adhesive in forming a wiring board by laminating a prepreg or film. In this operation, the resin composition may contain an electrically conductive inorganic material, dielectric inorganic material and the like, as in forming a film.

According to the invention, a wiring board may be produced from at least one member selected from the group consisting of prepregs produced by impregnating a substrate with the resin composition of the invention and films formed by molding the resin composition of the invention, or in combination with at least one member selected from the group consisting of prepregs and films conventionally used for wiring boards.

Wiring boards are not limited and can be any of rigid boards and flexible boards. The shape of boards can be properly selected from sheets, films, plates and the like. More specifically useful boards include, for example, copper-clad laminate boards, composite copper-clad laminate boards, flexible copper-clad laminate boards, build-up multilayer printed wiring boards, flexible printed wiring boards, carrier-attached resin films, bonding sheets, etc.

The resin composition of the invention can be used as ink for forming a pattern in electronic parts. Especially the resin composition of the invention is suitable for wiring boards, and in addition, for TFT liquid crystal, electroluminescence and the like.

The resin composition of the invention can be used for the following electronic parts as well as the foregoing electronic parts.

Materials constituting part or all of mechanism parts of electrical, electronic and telecommunications equipment such as connectors, relays, condensers, switches, coil bobbins, deflection yokes, CCD (charge coupled device), LED (light emitting diode) and the like.

Insulating materials for batteries, transformers, motors, antenna coils and the like.

Materials constituting all or part of mechanism parts of displays such as liquid crystal displays, EL displays, plasma displays, active matrix liquid crystal displays and the like, optically coupled semiconductor devices such as photocouplers, optoisolators and the like; examples of the mechanism parts being deflecting plates, glass substrates, electrode substrates, orientation films, liquid crystal layers, filters, reflection plates, electrically conductive layers for substrates, electrically conductive layers for electrodes, barrier layers and the like.

Materials constituting all or part of smart cards, smart tags and like IC cards.

The epoxy resin composition of the invention, like conventional epoxy resins, can be used not only as the above-mentioned materials for electronic parts, but also for purposes involving the use of epoxy resin. Examples of uses are electrical, electronic and telecommunications equipment, precision machinery, transportation equipment, manufacturing equipment, household utensils, civil engineering and construction materials, etc. More specific examples of uses are as follows.

Electrical, Electronic and Telecommunication Fields

Materials constituting all or part of housing, mechanism parts or structural parts for business or office automation equipment such as printers, computers, word processors, keyboards, PDA (personal digital assistants), telephones, mobile telephones, facsimile machines, copying machines, ECR (electronic cash registers), desk-top electronic calculators, electronic organizers, electronic dictionaries, etc., electrical household appliances and electrical equipment such as washing machines, refrigerators, rice cookers, cleaners, microwave ovens, lighting equipment, air conditioners, irons and kotatsu (low, covered table with a heat source underneath), audio-visual equipment such as TV, tuners, VTR, video cameras, camcorders, digital still cameras, radio cassette recorders, tape recorders, MD players, CD players, DVD players, LD players, HDD (hard disc drive), speakers, car navigation devices, liquid crystal displays and drivers thereof, EL displays, plasma displays and the like; coating materials for electrical wires, cables and the like; materials constituting all or part of cases for accommodating resistors, thermostats, thermal fuses and like electrical elements, bearing for motors, spacers, wire guides for dot printers and like sliding parts, etc.

Precision Machinery Field

Materials constituting all or part of housing, mechanism parts and structural parts for watches, clocks, microscopes, cameras, etc.

Transportation Field

Materials constituting all or part of yachts, boats and like ships, bodies of trains, automobiles, bicycles, motorcycles, aircraft and the like, mechanism parts or structural parts (frames, pipes, shafts, convertible tops, door trims, sun visors, wheel covers, hangers, hand straps, etc.); and materials constituting all or part of interior parts for transportation machinery (arm rests, package trays, sun visors, mattress covers and the like).

Manufacturing Equipment Field

Materials constituting all or part of mechanism parts and structural parts for robot arms, rolls, roll shafts, spacers, insulators, gaskets, thrust washers, gears, bobbins, piston members, cylinder members, pulleys, pump members, bearings, shaft members, plate springs, honeycomb structure materials, masking jigs, distribution boards, water proof pans and the like; and materials constituting all or part of water tanks, sewage tanks, raw tanks and like industrial tanks, pipes, resin molds, helmets, etc.

Household Utensils

Materials for all or part of sports equipment and equipment for leisure time amusement such as racket frames for badminton and tennis, shafts and heads for golf clubs, hockey sticks, ski boards, snowboards, skateboards, fishing rods, bats, supports for tents, bathtubs, wash basins, toilets, fittings thereof and like hygienic articles, seats, buckets, hoses, etc. Materials for a heat-resistant laminate formed on the surface of a top plate of furniture or a table, smoothly planed boards for furniture, cabinets and the like.

Civil Engineering and Construction Material Fields

Interior and exterior decorating materials for buildings, roof materials, floor materials, wall papers, windowpanes, sealing materials for window panes, reinforcement materials for concrete structural buildings (concrete bridge piers, concrete supports, etc.), concrete structures (concrete poles, wall surfaces, roads, etc.), repairing materials for pipe conduits such as underground pipes, etc.

In addition, films and containers formed from the resin composition of the invention can be used for food materials, materials for agriculture, forestry and fishery, medical articles, etc.

BEST MODE FOR CARRYING OUT THE INVENTION

The present invention will be specifically described below with reference to Examples and Comparative Examples. However, the scope of the invention is not limited by these examples. Parts and % mean weight parts and weight %, respectively unless otherwise specified. In addition, "—Ph—" and "—Ph" mean phenylene group and phenyl group, respectively.

The following materials were used in Examples and Comparative Examples.

(1) Epoxy Resin

Cresol novolak epoxy resin: epoxy equivalent 200, softening point 67° C. (Epikote 180S65, Yuka Shell Epoxy Co., Ltd.)

Alkyl-substituted biphenol epoxy resin (4,4'-bis(2,3-epoxypropoxy)-3,3',5,5'-tetramethylbiphenyl): epoxy equivalent 188, melting point 106° C.

(2) Compound Containing a Phenolic Hydroxyl Group

Novolak phenolic resin: hydroxyl group equivalent 106, softening point 83° C. Phenol/aralkyl resin (product of Mitsui Chemicals Inc.: Milex XL-225): hydroxyl group equivalent 167, softening point 70° C.

(3) Phosphazene Compound: Crosslinked or Non-crosslinked phenoxyphosphazene compound shown in Synthesis Examples 1 to 4

SYNTHESIS EXAMPLE 1

Synthesis of phenoxyphosphazene compound Having P-phenylene-crosslinked structure (hereinafter abbreviated to "FR-1")

A mixture of 1.1 moles (103.5 g) of phenol, 1.1 moles (44.0 g) of sodium hydroxide, 50 g of water and 500 ml of toluene was refluxed with heating, and water alone was removed from the system, giving a solution of sodium phenolate in toluene.

In parallel with the above reaction, a mixture of 0.15 moles (16.5 g) of hydroquinone, 1.0 mole (94.1 g) of phenol, 1.3 moles (31.1 g) of lithium hydroxide, 52 g of water and 600 ml of toluene was placed in a 4-necked, 2-liter flask. The mixture was refluxed with heating, and water alone was removed from the system, giving a solution of lithium salts of hydroquinone and phenol in toluene. 580 g of a 20% chlorobenzene solution containing 1.0 unit mole (115.9 g) of dichlorophosphazene oligomers (a mixture of 72% of trimer, 15% of tetramer, 8% of pentamer and hexamer, 3% of heptamer and 2% of octamer and higher oligomers) was added dropwise to the toluene solution at 30° C. or lower with stirring, followed by reaction at 110° C. for 4 hours with stirring. To the reaction mixture was added the above prepared toluene solution of sodium phenolate with stirring, and the reaction was continued at 110° C. for 8 hours.

After the reaction was completed, the reaction mixture was washed three times with 1.0 liter of a 3% aqueous solution of sodium hydroxide and then three times with 1.0 liter of water, and the organic phase was concentrated under reduced pressure. The obtained concentrate was concentrated to dryness at 80° C. at a pressure of 266 Pa or less to give 211 g of a white powder.

The obtained crosslinked phoenoxyphosphazene had a hydrolyzable chlorine content of 0.01% or less, and the composition of final product was

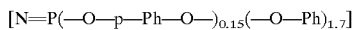

from the phosphorus content and CHN elemental analysis data.

The crosslinked phenoxyphosphazene obtained above had a weight average molecular weight (Mw) of 1100 (calculated as standard polystyrene, GPC analysis) but did not show a definite melting point, and had a decomposition starting temperature of 306° C. and a 5% weight loss temperature of 311° C. as determined by the TG/DTA analysis.

Further, the quantity of residual hydroxyl groups was determined by the acetylation method and was found to be not larger than the detection limit ($1 \times 10^{-6}$ equivalents/g, as hydroxyl equivalent per gram of the sample).

SYNTHESIS EXAMPLE 2

Synthesis of phenoxyphosphazene compound having 2,2-bis(p-oxyphenyl)isopropylidene-crosslinked structure (hereinafter abbreviated to "FR-2")

0.7 mole (65.9 g) of phenol and 500 ml of toluene were placed in a 4-necked, 1-liter flask, and while maintaining the internal temperature at 25° C., 0.65 gram atoms(14.9 g) of metallic sodium in the form of cut pieces was added thereto with stirring. After completion of the addition, stirring was continued for 8 hours at 77 to 113° C. until the metallic sodium was completely consumed.

In parallel with the above reaction, 0.25 mole (57.1 g) of bisphenol-A, 1.1 moles (103.5 g) of phenol and 800 ml of tetrahydrofuran (THF) were placed in a 4-necked, 3-liter flask, and while maintaining the internal temperature at 25° C., 1.6 gram atoms (11.1 g) of metallic lithium in the form of cut pieces was added thereto with stirring. After completion of the addition, stirring was continued for 8 hours at 61 to 68° C. until the metallic lithium was completely consumed. While maintaining the internal temperature at 20° C. or lower, 386 g of 30% chlorobenzene solution containing 1.0 unit mole (115.9 g) of dichlorophosphazene oligomers (a mixture of 72% of trimer, 15% of tetramer, 8% of pentamer and hexamer, 3% of heptamer and 2% of octamer and higher oligomers) was added dropwise to the resulting slurry solution over 1 hour, followed by reaction at 80° C. for 4 hours. Subsequently, while maintaining the internal temperature at 20° C., the sodium phenolate solution separately prepared was added to the reaction mixture with stirring over 1 hour, followed by reaction at 80° C. for 10 hours.

After the reaction was completed, the reaction mixture was concentrated to remove THF, and 1 liter of toluene was added to the concentrate. The resulting toluene solution was washed three times with 1 liter of 2% NaOH and then three times with 1.0 liter of water, and the organic phase was concentrated under reduced pressure. The obtained concentrate was concentrated to dryness at 80° C. at a pressure of 266 Pa or less to give 230 g of a white powder.

The obtained crosslinked phenoxyphosphazene had a hydrolyzable chlorine content of 0.01%, and a composition

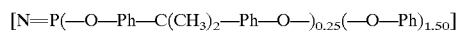

which was found from the phosphorus content and CHN elemental analysis data.

The obtained crosslinked phsnoxyphosphazene had a weight average molecular weight (Mw) of 1140 (calculated as standard polystyrene, GPC analysis) and did not show a definite melting point, and had a decomposition starting temperature of 310° C. and a 5% weight loss temperature of 315° C. as determined by the TG/DTA analysis.

The quantity of the residual hydroxyl groups was determined by the acetylation method and was found to be not larger than the detection limit by the acetylation method ($1 \times 10^{-6}$ equivalents/g, as hydroxyl equivalent per gram of the sample).

SYNTHESIS EXAMPLE 3

Synthesis of phenoxyphosphazene having 4,4'-sulfonyldiphenylene(bisphenol-S residue)-crosslinked structure (hereinafter abbreviated to "FR-3")

0.4 mole (37.6 g) of phenol and 500 ml of tetrahydrofuran (THF) were placed in a 4-necked, 1-liter flask, and while maintaining the internal temperature at 25° C., 0.45 gram atoms (9.2 g) of metallic sodium in the form of cut pieces was added thereto with stirring. After completion of the addition, stirring was continued for 5 hours at 65 to 72° C. until the metallic sodium was completely consumed.

In parallel with the above reaction, 1.70 moles (160.0 g) of phenol and 0.05 mole (12.5 g) of bisphenol-S were dissolved in 500 ml of THF in a 4-necked, 1-liter flask, and 1.8 gram atoms (41.4 g) of metallic sodium in the form of cut pieces was added thereto at 25° C. or lower with stirring. After completion of the addition, the temperature was elevated to 61° C. over 1 hour, and stirring was continued for 6 hours at 61 to 68° C., giving a mixed solution of sodium phenolate. The solution was added dropwise to 580 g of a 20% chlorobenzene solution containing 1.0 unit mole (115.9 g) of dichlorophosphazene oligomers (a mixture of 72% of trimer, 15% of tetramer, 8% of pentamer and hexamer, 3% of heptamer, 2% of octamer and higher oligomers) with cooling and stirring at 25° C. or lower, followed by reaction at 71 to 73° C. for 5 hours with stirring.

Then, the sodium phenolate solution prepared above was added dropwise to the reaction mixture, and the reaction was continued at 71 to 73° C. for 10 hours.

After the reaction was completed, the reaction mixture was concentrated and dissolved again in 500 ml of chlorobenzene. The solution was washed three times with 5% aqueous NaOH solution, once with 5% sulfuric acid, once with 5% aqueous sodium bicarbonate solution and three times with water. Then, the organic phase was concentrated at 266 Pa or less and the concentrate was concentrated to dryness, giving 220 g of a white solid.

The obtained crosslinked phenoxyphosphazene had a hydrolyzable chlorine content of 0.01% or less, and a composition

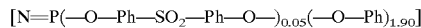
$[N=P(-O-Ph-SO_2-Ph-O-)_{0.05}(-O-Ph)_{1.90}]$ which was found from the phosphorus content and CHN elemental analysis data.

The obtained crosslinked phenoxyphosphazene had a weight average molecular weight (Mw) of 1070 (calculated as standard polystyrene), a melting temperature (Tm) of 103° C., a decomposition starting temperature of 334° C. and a 5% weight loss temperature of 341° C. as determined by the TG/DTA analysis.

The quantity of the residual hydroxyl groups was determined and was not larger than the detection limit by the acetylation method ($1 \times 10^{-6}$ equivalents/g, as hydroxyl equivalent per gram of the sample).

SYNTHESIS EXAMPLE 4

Synthesis of a mixture of phenoxyphosphazenes
$([N=P(-OPh)_2]_3$ and $[N=P(-OPh)_2]_4)$
(hereinafter abbreviated to "FR-4")

FR-4 was prepared according to the process disclosed in H. R. Allcock "Phosphorus-Nitrogen Compounds", Academic Press, (1972), 151.

More specifically, a toluene solution of sodium phenolate was added with stirring to 580 g of a 20% chlorobenzene solution containing 1.0 unit mole (115.9 g) of dichlorophosphazene oligomers (a mixture of 62% of trimer and 38% of tetramer), followed by a reaction at 110° C. for 10 hours. It was confirmed that the amount of residual chlorine was <0.01% and that the compound had the following composition.

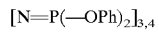
$[N=P(-OPh)_2]_{3,4}$

EXAMPLES 1 TO 6

The epoxy resin composition of the invention was prepared by mixing an epoxy resin, a compound containing a phenolic hydroxyl group, crosslinked phenoxyphosphazene compound (compounds shown in Synthesis Examples 1 to 3, FR-1 to FR-3), fused silica (crushed silica having an average particle size of 17.5 μm and specific surface area 1.5 m²/g), triphenylphosphine, carnauba wax, carbon black and γ-glycidoxypropyl trimethoxysilane (coupling agent) in a weight ratio as shown in Table 1.

Then the molding materials of Examples 1 to 6 were prepared from the epoxy resin composition of the invention by kneading with rolls at a kneading temperature of 80 to 90° C. for a kneading time of 10 minutes.

COMPARATIVE EXAMPLES 1 AND 2

The molding materials of Comparative Examples 1 and 2 were prepared according to the formulation shown in Table 1 in the same manner as in Examples except that the non-crosslinked phenoxyphosphazene compound (the compound indicated in Synthesis Example 4, FR-4) was used as a flame retardant.

COMPARATIVE EXAMPLE 3

The molding material of Comparative Example 3 was prepared according to the formulation shown in Table 1 in the same manner as in Examples except that condensed phosphate (CR-741, Daihachi Kagaku Kogyo Co., Ltd., hereinafter abbreviated to "FR-5") was used as a flame retardant.

COMPARATIVE EXAMPLES 4 AND 5

The molding materials of Comparative Examples 4 and 5 were prepared according to the formulation shown in Table 1 in the same manner as in Examples except that brominated bisphenol-A epoxy resin having an epoxy equivalent of 375, softening point of 80° C. and bromine content of 48 wt % and antimony trioxide were used.

The properties of the molding materials prepared in Examples and Comparative Examples described above were evaluated by the following methods.

(1) Hardness in a Heat

The molding material was molded using a mold for molding a disk 100 mm in diameter and 3 mm in thickness by transfer press under conditions of 180±3° C., 6.9±0.17 MPa and 90 seconds. The hardness in a heat of the molded product was measured with a shore hardness meter (D type) immediately after completion of molding. The higher the value of hardness in a heat, the better the result. The hardness in a heat is an index of thermal impact resistance.

(2) Coefficient of Water Absorption

The coefficient of water absorption was measured to evaluate the moisture resistance.

According to JIS-K-6911, a disk 50 mm in diameter and 3 mm in thickness was produced and was humidified at 85° C. and 85% RH. After each specified time interval, the disk was weighed to find out the change of weight.

(3) Adhesion

The molding material was molded on aluminum foil 30 μm in thickness by transfer press under conditions of 180±3° C., 6.9±0.17 MPa and 90 seconds. Thereafter a peel strength in a direction at an angle of 90 degrees to the aluminum foil was measured.

(4) Flame Retardancy

The molding material was molded by transfer press under conditions of 180±3° C., 6.9±0.17 MPa and 90 seconds using a mold for molding a test piece 1/16 inch (about 1.6 mm) in thickness. Thereafter the molded product was cured 5 hours later at 180±5° C. The evaluation was made according to UL 94-V0 testing method.

The method of testing the flame retardancy under UL-94 is as follows. The flame retardancy is evaluated based on the time and dripping degree. The time involved is a time from ignition of five test pieces to extinction (first period), a time from re-ignition of the test pieces to extinction (second period) and afterglow time. In the present invention, a total time of five test pieces lapsed until extinction (in Table 1, 10 (5 test pieces×2 times)) is described as a total of burning time (sec). When a total of extinction time is less than 50 seconds, the result is rated as V-0. The shorter the extinction time even at V-0 is, the higher the flame retardancy is.

(5) High Temperature Shelf Life

To evaluate the heat resistance, the high temperature shelf life was determined.

A test element having an aluminm wiring at a line-space of 10 μm on a silicon substrate with an oxide film of 5 μm thickness measuring 5 mm×9 mm was connected with a silver paste to a partly silver-plated lead frame of 42 alloy. The bonding pad of the element was combined by an Au line with an inner lead at 200° C. using a thermosonic wire bonding. Thereafter a 16-pin DIP (dual inline package) was produced by transfer molding. The obtained test IC was retained in a high temperature tank at 200° C. and taken out after each specified time interval to conduct a continuity test for checking the number of unacceptable elements. The IC package to be used for evaluation was produced by molding the molding material under conditions of 180±3° C., 6.9±0.17 MPa and 90 seconds and curing the molded product at 180±5C after 5 hours.

The obtained evaluation results are shown in Table 1.

The epoxy resin compositions of Examples containing crosslinked phenoxyphosphazene compounds according to the invention are superior in high temperature shelf life and in flame retardancy.

Effect of the Invention

The epoxy resin composition of the invention is halogen-free and antimony-free and is excellent in flame retardancy. When an element for an electronic part such as LSI and VLSI is encapsulated by the epoxy resin composition of the invention, the obtained electronic part is outstanding in moldability and thermal impact resistance, and is superior in

TABLE 1

| component | Example | | | | | | Comparative Example | | | | |
|---|---|---|---|---|---|---|---|---|---|---|---|
| | 1 | 2 | 3 | 4 | 5 | 6 | 1 | 2 | 3 | 4 | 5 |
| (A) Cresol novolak epoxy resin | 100.0 | 100.0 | 100.0 | — | — | — | 100.0 | — | 100.0 | 85.0 | — |
| Alkyl-substituted biphenyl epoxy resin | — | — | — | 100.0 | 100.0 | 100.0 | — | 100.0 | — | — | 85.0 |
| Brominated bisphenol-A epoxy resin | — | — | — | — | — | — | — | — | — | 15.0 | 15.0 |
| (B) Novolak phenol resin | 53.0 | 25.0 | 38.0 | — | — | — | 53.0 | — | 53.0 | 49.0 | — |
| Phenol aralkyl resin | — | — | — | 89.0 | 48.0 | 66.0 | — | 88.8 | — | — | 82.0 |
| (C) Flame retardant Phenoxyphosphazene compound | | | | | | | | | | | |
| FR-1 | 37.0 | — | — | 35.0 | — | — | — | — | — | — | — |
| FR-2 | — | 37.0 | — | — | 35.0 | — | — | — | — | — | — |
| FR-3 | — | — | 37.0 | — | — | 35.0 | — | — | — | — | — |
| FR-4 | — | — | — | — | — | — | 37.0 | 35.0 | — | — | — |
| FR-5 | — | — | — | — | — | — | — | — | 37.0 | — | — |
| Antimony trioxide | — | — | — | — | — | — | — | — | — | 10.0 | 5.0 |
| (D) Fused silica | 594.0 | 594.0 | 594.0 | 594.0 | 594.0 | 594.0 | 594.0 | 1322.0 | 594.0 | 501.0 | 1119.0 |
| Triphenyl phosphine | 1.5 | 1.5 | 1.5 | 1.5 | 1.5 | 1.5 | 1.5 | 1.5 | 1.5 | 1.5 | 2.5 |
| Carnauba wax | 2.0 | 2.0 | 2.0 | 2.0 | 2.0 | 2.0 | 2.0 | 2.0 | 2.0 | 2.0 | 2.0 |
| Carbon black | 1.5 | 1.5 | 1.5 | 1.5 | 1.5 | 1.5 | 1.5 | 1.5 | 1.5 | 1.5 | 1.5 |
| Coupling agent | 3.0 | 3.0 | 3.0 | 4.5 | 4.5 | 4.5 | 3.0 | 4.5 | 3.0 | 3.0 | 4.5 |
| Amount of component (D) (wt %) | 75.0 | 77.7 | 76.4 | 71.8 | 75.5 | 73.8 | 75.0 | 85.0 | 75.0 | 75.0 | 85.0 |
| Amount of component (C) (wt %) | 4.7 | 4.8 | 4.8 | 4.2 | 4.5 | 4.4 | 4.7 | 2.3 | 4.7 | — | — |
| Test results | | | | | | | | | | | |
| Flame retardancy UL94 | V-0 | V-0 | V-0 | V-0 | V-0 | V-0 | V-0 | V-0 | V-0 | V-0 | V-0 |
| UL94: Total of burning time of 10 test pieces (sec) | 0 | 0 | 0 | 0 | 0 | 0 | 30 | 28 | 32 | 20 | 19 |
| Hardness in a heat | 78 | 80 | 81 | 82 | 81 | 82 | 78 | 74 | 68 | 85 | 78 |
| Coefficient of water absorption (72 h, %) | 0.08 | 0.07 | 0.06 | 0.05 | 0.06 | 0.04 | 0.26 | 0.18 | 0.41 | 0.29 | 0.2 |
| Adhesion (N/m) | 350 | 360 | 365 | 790 | 790 | 800 | 350 | 770 | 290 | 310 | 710 |
| Test results (high temperature shelf life) | | | | | | | | | | | |
| 200 h | 0/10 | 0/10 | 0/10 | 0/10 | 0/10 | 0/10 | 0/10 | 0/10 | 0/10 | 0/10 | 0/10 |
| 400 h | 0/10 | 0/10 | 0/10 | 0/10 | 0/10 | 0/10 | 0/10 | 0/10 | 3/10 | 1/10 | 5/10 |
| 600 h | 0/10 | 0/10 | 0/10 | 0/10 | 0/10 | 0/10 | 0/10 | 0/10 | 5/10 | 3/10 | 10/10 |
| 800 h | 0/10 | 0/10 | 0/10 | 0/10 | 0/10 | 0/10 | 1/10 | 1/10 | 10/10 | 8/10 | — |

The resin compositions of Examples 1 to 6 containing crosslinked phenoxyphosphazene compounds are higher in hardness in a heat, lower in coefficient of water absorption, and higher in bond strength and in high temperature shelf life than those of Comparative Examples 1 and 2 containing non-crosslinked phosphazene compounds and those of Comparative Example 3 containing condensed phosphate, and are significantly higher in high temperature shelf life than those of Comparative Examples 4 and 5 containing brominated bisphenol-A epoxy resin and antimony trioxide.

Especially the epoxy resin compositions of Examples 4 to 6 are excellent in adhesion because of use of alkyl-substituted bisphenol epoxy resin having a biphenyl skeleton.

moisture resistance, heat resistance and like long term reliability so that its industrial value is very high.

What is claimed is:

1. An epoxy resin composition comprising, as essential components, (A) an epoxy resin, (B) a phenolic hydroxyl group-containing compound, (C) a crosslinked phenoxyphosphazene compound, and (D) an inorganic filler, the crosslinked phenoxyphosphazene compound being a crosslinked phenoxyphosphazene compound in which at least one phosphazene compound selected from the group consisting of a cyclic phenoxyphosphazene represented by the formula (1)

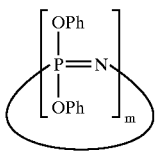

(wherein m is an integer of 3 to 25 and Ph is a phenyl group) and a linear phenoxyphosphazene represented by the formula (2)

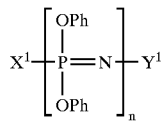

(wherein $X^1$ represents a group —N=P(OPh)$_3$ or a group —N=P(O)OPh, $Y^1$ represents a group —P(OPh)$_4$ or a group —P(O)(OPh)$_2$, and n is an integer of 3 to 10000 and Ph is as defined above) is crosslinked with at least one crosslinking group selected from the group consisting of o-phenylene group, m-phenylene group, p-phenylene group and a bisphenylene group represented by the formula (3)

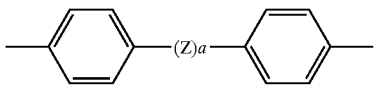

(wherein Z is —C(CH$_3$)$_2$—, —SO$_2$—, —S— or —O— and a is 0 or 1);

(a) each of the crosslinking groups is interposed between the two oxygen atoms left after the elimination of phenyl groups from the phosphazene compound;
(b) the amount of the phenyl groups in the crosslinked compound is 50 to 99.9% based on the total amount of the phenyl groups in said phosphazene compound represented by the formula (1) and/or said phosphazene compound represented by the formula (2); and
(c) the crosslinked phenoxyphosphazene compound has no free hydroxyl group in the molecule,
the amount of component (C) being in the range of 0.01 to 30 wt. % based on the total amount of components (A), (B) and (C), and the amount of component (D) being in the range of 60 to 98 wt. % based on the total amount of components (A), (B), (C) and (D).

2. The epoxy resin composition according to claim 1, wherein the epoxy resin to be used as component (A) is at least one member selected from the group consisting of phenol novolak epoxy resin, brominated phenol novdak epoxy resin, ortho-cresol novalak epoxy resin, naphtol novolak epoxy resin, bisphenol-A epoxy resin, brominated bisphenol-A epoxy resin, bisphenol-F epoxy resin, bisphenol-AD epoxy resin, bisphenol-S epoxy resin, alkyl-substituted bisphenol epoxy resin, phenol epoxy resin, aliphatic epoxy resign, glycidyl ester epoxy resins, heterocyclic epoxy resin and those perpared by modifying them.

3. The epoxy resin composition according to claim 1, wherein the epoxy resin to be used as component (A) is at least one member selected from the group consisting of phenol novolak epoxy resin and alkyl-substituted bisphenol epoxy resin.

4. The epoxy resin composition according to claim 1, wherein the phenolic hydroxyl group-containing compound serving as component (B) is phenolic resin.

5. The epoxy resin composition according to claim 4, wherein the phenolic resin is at least one member selected from the group consisting of phenol novolak resin and cresol novolak resin.

6. The epoxy resin composition according to claim 1, wherein the epoxy resin as component (A) and the phenolic hydroxyl group-containing compound as component (B) are present in amounts such that the ratio of the number of hydroxyl group of component (B)/the number of epoxy group of component (A) is in the range of approximately 0.7 to 1.3.

7. The epoxy resin composition according to claim 1, wherein the inorganic filler as component (D) is at least one member selected from the group consisting of fused silica and alumina.

8. The epoxy resin composition according to claim 7, wherein the inorganic filler as component (D) is fused silica.

9. A material for encapsulating an element for an electronic part, the material being formed from the epoxy resin composition as defined in any of claims 1, 2, 3, and 4 to 8.

10. The material for encapsulating an electronic part according to claim 9, wherein the element for the electronic part is a semiconductor.

11. An electronic part wherein the epoxy resin composition as defined in any of claims 1, 2, 3, and 4 to 8 is used as the encapsulating material.

* * * * *

UNITED STATES PATENT AND TRADEMARK OFFICE
CERTIFICATE OF CORRECTION

PATENT NO. : 6,905,768 B2
DATED : June 14, 2005
INVENTOR(S) : Tada et al.

It is certified that error appears in the above-identified patent and that said Letters Patent is hereby corrected as shown below:

Column 22,
Line 6, "novdak" should be -- novolak --.
Line 7, "novalak" should be -- novolak --.

Signed and Sealed this

Twenty-eighth Day of February, 2006

JON W. DUDAS
*Director of the United States Patent and Trademark Office*